(12) United States Patent
Gao et al.

(10) Patent No.: US 9,350,489 B2
(45) Date of Patent: *May 24, 2016

(54) FEC FRAME HEADER DESIGN FOR CABLE TELEVISION SIGNALS

(75) Inventors: Wen Gao, West Windsor, NJ (US); Hou-Shin Chen, East Brunswick, NY (US)

(73) Assignee: Thomson Licensing, Boulogne-Billancourt (FR)

(*) Notice: Subject to any disclaimer, the term of this patent is extended or adjusted under 35 U.S.C. 154(b) by 726 days.

This patent is subject to a terminal disclaimer.

(21) Appl. No.: 12/998,660

(22) PCT Filed: Nov. 17, 2009

(86) PCT No.: PCT/US2009/006138
§ 371 (c)(1),
(2), (4) Date: May 16, 2011

(87) PCT Pub. No.: WO2010/056363
PCT Pub. Date: May 20, 2010

(65) Prior Publication Data
US 2011/0222610 A1  Sep. 15, 2011

(51) Int. Cl.
*H04L 27/20* (2006.01)
*H04L 1/00* (2006.01)
(Continued)

(52) U.S. Cl.
CPC ............ *H04L 1/0057* (2013.01); *H03M 13/136* (2013.01); *H03M 13/6555* (2013.01); *H04L 1/0072* (2013.01); *H04L 27/20* (2013.01); *H04L 27/22* (2013.01); *H04L 1/0003* (2013.01)

(58) Field of Classification Search
CPC .... H04N 21/2383; H04J 3/0685; H04J 3/068; H04L 1/0057
USPC ...................... 375/240.27; 370/503, 320, 342; 714/752, 774
See application file for complete search history.

(56) References Cited

U.S. PATENT DOCUMENTS 6,211,919 B1  4/2001  Zink et al.
6,426,978 B1  7/2002  Bottomley et al.
(Continued)

FOREIGN PATENT DOCUMENTS

CN  1348310  5/2002
CN  1477831  2/2004
(Continued)

OTHER PUBLICATIONS

Park et al., "Efficient Multicast Video Streaming for IPTV Service Over WLAN Using CC-FEC", 2008 International Conference on Internet Computing in Science and Engineering, 2008, pp. 215-222.
(Continued)

*Primary Examiner* — Tung Vo
*Assistant Examiner* — Rowina Cattungal
(74) *Attorney, Agent, or Firm* — Robert D. Shedd; Ronald J. Kolcznski; Ivonete Markman

(57) ABSTRACT

An efficient and reliable encoding method suitable for header information in a digital cable television transmission system is provided. An embodiment is shown for FEC frame headers in a DVB-C2 standard, along with the detection algorithm for the FEC header. In the DVB-C2 Standard, Adaptive Coding and Modulation (ACM) or Variable Coding and Modulation (VCM) is applied to each FEC block to provide as much flexibility as possible. As a result, a frame header is attached in front of each FEC frame to inform the coding rate, modulation type and physical layer pipe identifier. Besides the signaling of physical layer related information, the FEC frame header has to provide a structure so that it can be easily and reliably detected in the receiver. Motivated by the need in DVB-C2 Standard, an efficient and reliable method and apparatus to encode the FEC header for DVB-C2 Standard is provided in at least one implementation in this disclosure. In addition, the detection algorithm of the FEC header is described.

26 Claims, 4 Drawing Sheets

(51) Int. Cl.
  *H03M 13/13* (2006.01)
  *H03M 13/00* (2006.01)
  *H04L 27/22* (2006.01)

(56) References Cited

U.S. PATENT DOCUMENTS

| | | | |
|---|---|---|---|
| 6,590,889 B1 * | 7/2003 | Preuss | H04B 7/1858 370/321 |
| 6,865,236 B1 | 3/2005 | Terry | |
| 6,868,075 B1 | 3/2005 | Narvinger et al. | |
| 7,627,058 B2 | 12/2009 | Poberezhskiy | |
| 8,238,436 B2 | 8/2012 | Yang | |
| 2002/0013926 A1 | 1/2002 | Kim et al. | |
| 2003/0058954 A1 * | 3/2003 | He | 375/262 |
| 2004/0252725 A1 * | 12/2004 | Sun | H04L 1/0057 370/503 |
| 2005/0053169 A1 * | 3/2005 | Jia | H04B 7/0417 375/267 |
| 2006/0077947 A1 | 4/2006 | Kim et al. | |
| 2007/0206638 A1 | 9/2007 | Santoru et al. | |
| 2007/0256001 A1 * | 11/2007 | Suzuki | H04B 7/18582 714/774 |
| 2008/0184087 A1 | 7/2008 | Hayashi | |
| 2008/0192676 A1 * | 8/2008 | Mantha | H04L 1/0007 370/320 |
| 2008/0250294 A1 * | 10/2008 | Ngo | H04L 1/007 714/752 |
| 2009/0161788 A1 | 6/2009 | Giraud et al. | |
| 2010/0115277 A1 | 5/2010 | Roscoe | |
| 2010/0135335 A1 | 6/2010 | Matsumoto et al. | |
| 2010/0142461 A1 | 6/2010 | Miki et al. | |

FOREIGN PATENT DOCUMENTS

| | | |
|---|---|---|
| CN | 101150574 | 3/2008 |
| CN | 101222290 | 7/2008 |
| EP | 0782292 | 7/1997 |
| EP | 0868082 | 9/1998 |
| EP | 1487146 | 12/2004 |
| JP | 10304322 | 11/1998 |
| JP | 2003158519 | 5/2003 |
| JP | 2004357323 | 12/2004 |
| JP | 200506338 | 1/2005 |
| JP | 2005210211 | 8/2005 |
| JP | 2005260600 | 9/2005 |
| JP | 2005260611 | 9/2005 |
| JP | 2007228598 | 9/2007 |
| JP | 2007259422 | 10/2007 |
| JP | 2008510423 | 4/2008 |
| JP | 2008182648 | 8/2008 |
| JP | 2008278188 | 11/2008 |
| WO | WO9907089 | 2/1999 |
| WO | WO2005006693 | 1/2005 |
| WO | WO2007042685 | 4/2007 |
| WO | WO2007148863 | 12/2007 |
| WO | WO2008123024 | 10/2008 |

OTHER PUBLICATIONS

CCSDS, The Consultative Committee for Space Data Systems: "DVB-S2 Coding & Modulation Standard Use for High Data Rate TM Links. Experimental Specification", Resarch and Development for Space Data Systems Standards, Jun. 2007.

Nouri et al., "TEDS: A High Speed Digital Mobile Communication Air Interface for Professional Users Part I: Overview of Physcal Layer", Vehicular Technology Conference, 2007, VTC2007-Spring, IEEE 65th, PI, Apr. 1, 2007, pp. 959-963.

Paterson et al., "Efficient Decoding Algorithms for Generalised Reed-Muller Codes", 2008 International Conference on Internet Computing in Science and Engineering, Nov. 1, 1998, pp. 1-26.

Search Report Dated Mar. 17, 2010.

Liang et al.: A Modified Partial Transmit Sequence With PAPR Reduction and Error Correction in 16-QAM OFDM Systems. 2008 International symposium on Intelligent Signal Processing and Communication Systems (ISPACS2008) 4 pgs. Swissotel Le Concorde, Bangkok, Thailand 7.

* cited by examiner

FEC FRAME HEADER DESIGN FOR CABLE TELEVISION SIGNALS

CROSS-REFERENCE TO RELATED APPLICATIONS

This application claims the benefit, under 35 U.S.C. §365 of International Application PCT/US2009/006138, filed Nov. 17, 2009, which was published in accordance with PCT Article 21(2) on May 20, 2010 in English and which claims the benefit of U.S. provisional patent application No. 61/115,123, filed Nov. 17, 2008.

TECHNICAL FIELD

The present principles relate to cable transmission systems and techniques. More particularly, it relates to an FEC header design for cable television transmissions.

BACKGROUND OF THE INVENTION

Cable, satellite and terrestrial networks are three major mediums to deliver digital broadcasting services to end customers. Unlike satellite and terrestrial transmission, cable channels do not exhibit significant time and frequency selectivity. Consequently, spectrally efficient modulations (i.e., 256-QAM and 1024-QAM), are employed in cable networks to meet the capacity demand of bandwidth-consuming services such as HDTV and VoD, and to boost the penetration of digital video broadcasting. Recently, low-density parity-check (LDPC) codes have been introduced in DVB-S2 and DVB-T2 standards because of their design flexibility, decoding simplicity and the universally excellent error correction performance over various channel types.

LDPC codes are a class of Forward Error Correction (FEC) block codes, often used in transmission environments to protect audio and/or video data. These Forward Error Correction codes increase the possibility of receivers recovering from and correcting errors in a received multimedia stream, without the need to retransmit data that is received with errors. The FEC error control system requires the transmitter add redundant data to a data stream. The maximum fraction of errors that can be corrected by the FEC is determined by the way the error correction code is calculated. Examples of FEC are block codes such as LDPC codes, that work on fixed-sized blocks, packets of bits, or symbols of a predetermined size, and convolutional codes that work on bit or symbol streams of arbitrary length. Many types of block error correction codes exist, among which are Reed-Solomon or, as already mentioned, the LDPC (Low-Density Parity Check). Other types of error correction codes have been developed for specific use in transmission of digital video streams over IP networks, such as SMPTE 2022 (Society of Motion Picture and Television Engineers), which unlike other typical FEC schemes such as Reed-Solomon, relies on very simple algorithms, and is useful in environments where limited resources are available, such as a Set Top Box receiver for Digital Television.

The Forward Error Correction codes are calculated during transmission time, so as to protect the multimedia stream as it is transmitted over a network, including any supplementary data added for the transmission. However, calculating error correction codes is demanding in terms of calculation resources. Therefore, in practice, error correction codes are generated for multimedia data to be transmitted in a broadcast-like manner, that is, when the same multimedia data can serve many receivers simultaneously. Examples of broadcast networks besides cable networks are TV/radio satellite or terrestrial broadcasting or IP multicast over wired or wireless transport media.

As a result of LDPC codes, frameworks such as, for example, density evolution, differential evolution and extrinsic information transfer (EXIT) charts, have been invoked to design and analyze the degree profile of a code ensemble. In terms of the threshold Signal-to-Noise Ratio (SNR) for decoding convergence, codes constructed following these frameworks can approach the Shannon limit closely, assuming the block length is infinite, the code structure is random and the number of decoding iterations is unbounded. However, from the perspective of practical implementation, the random structure usually leads to prohibitive encoding/decoding complexity and memory requirements. For this reason, structured LDPC codes that can achieve a better tradeoff between power efficiency and implementation simplicity have become a more appealing option for system designers. For instance, the error control codes adopted by ETSI Second Generation Digital Video Broadcasting Standard for Satellite Channels (DVB-S2), IEEE 802.11n and IEEE 802.16 standards all belong to the category of structured LDPC codes.

On the other hand, the DVB-S2 LDPC codes family, which were originally designed for forward error control in satellite communications, have also been used by DVB-T2 (Second Generation DVB Standard for Terrestrial Channels), and are strongly recommended for DVB-C2 (Second Generation DVB Standard for Cable Channels). In addition to the consideration for system compatibility, the main reason behind the use of DVB-S2 codes can be attributed to their universal superior performance under various channel conditions. However, to meet the demand by cable operators for higher spectral efficiency and flexible throughputs, a technical challenge for using the DVB-S2 codes in DVB-C2 lies in the mapping of the given codes to constellations of very high order, which range from 256-QAM to 4096-QAM.

The DVB-C2 project has attempted to use the contents of the DVB-T2 Standard as much as possible. OFDM modulation will be adopted as well as the coding technique (BCH+LDPC) specified in DVB-T2 Standard. However, DVB-T2 Standard is designed for use in the terrestrial wireless channel while the DVB-C2 Standard is designed for use in the cable channel. A cable channel differs from a terrestrial channel in that a cable channel is a high quality (high SNR) channel with only a few weak echoes. Also, cable television operators have fewer spectrum restrictions than terrestrial broadcasters. Therefore, the signal frame structure and preambles used in DVB-T2 may not be suitable to be reused in DVB-C2 Standard.

A frame header of Forward Error Correction (FEC) is designed for use in the DVB-C2 Standard. In the DVB-C2 Standard, Adaptive Coding and Modulation (ACM) or Variable Coding and Modulation (VCM) is applied to each FEC block to provide as much flexibility as possible. The FEC block is composed of a Bose-Chaudhuri-Hocquenghem (BCH) outer code and a Low-Density-Parity-Check (LDPC) inner code. Two dimensional interleaving is also performed. Interleaving is a procedure for rearranging the order of a sequence to fulfill different objectives. For channels subject to selective fading over time and frequency domains, bit and/or symbol interleaving have been used in conjunction with channel coding to distribute the error bursts. In addition, bit interleaving is employed by concatenated codes, particularly Turbo codes, to scramble the information bits to the second constituent encoder so that a long random code can be generated. A frame header is attached in front of each FEC frame to indicate the coding rate, modulation type and physical layer pipe identifier. Besides the signaling of physical layer related information, the FEC frame header has to provide a structure so that it can be easily and reliably detected in the receiver.

SUMMARY OF THE INVENTION

An efficient and reliable FEC frame header for digital cable television transmission is provided in at least one implementation in this disclosure. In addition, the detection algorithm of the FEC header is described. One possible implementation is shown, using the DVB-C2 standard as an example.

A frame header of Forward Error Correction (FEC) is designed for use in the DVB-C2 Standard. In the DVB-C2 Standard, Adaptive Coding and Modulation (ACM) or Variable Coding and Modulation (VCM) is applied to each FEC block to provide as much flexibility as possible. As a result, a frame header is attached in front of each FEC frame to inform the coding rate, modulation type and physical layer pipe identifier. Besides the signaling of physical layer related information, the FEC frame header has to provide a structure so that it can be easily and reliably detected in the receiver. Motivated by the need in DVB-C2 Standard, an efficient and reliable method and apparatus to encode the FEC header for DVB-C2 Standard is provided in at least one implementation in this disclosure. In addition, the detection algorithm of the FEC header is described.

DETAILED DESCRIPTION OF THE INVENTION

The DVB-C2 Standard is the next generation digital cable transmission system being developed by the DVB Project. The DVB-C2 Standard uses the contents of the DVB-T2 terrestrial transmission standard as much as possible. As a result, OFDM modulation will be adopted as well as the coding technique (BCH+LDPC) specified in DVB-T2 Standard. However, it must be noted that DVB-T2 Standard is designed for use in the terrestrial wireless channel while the DVB-C2 Standard is designed for use in the cable channel. Cable channels differ from wireless channels because the cable channel is a high quality (high SNR) channel with only a few weak echoes and because the wireless spectrum assigned for TV broadcasting is defined by the FCC while the spectrum of the cable networks can be used with somewhat fewer limitations. Consequently, the signal frame structure and preambles used in DVB-T2 may not be suitable to be used in DVB-C2 Standard. The principles described herein allow an FEC frame header to be detected under noisy channel conditions with minimal complexity.

The data transmitted according to the DVB-C2 standard is contained in Data Slice Packets. Data Slice Packets are formed from one or two FEC Frame cells. These Data Slice Packets can either be Data Slice Type 1 or Data Slice Type 2. Data Slice Type 1 packets only transmit the FEC Frame data and use a pointer within the Level 1 Signaling Part 2 to detect their start. Data Slice Type 2 packets carry a 16-bit FEC Frame header that allows for synchronization to the Data Slice Packets without further information being transmitted. This header carries information regarding the modulation, coding parameters, PLP identifiers, and number of FEC Frames (one or two) following the header. Encoding of the header information must ensure that it can be properly synchronized and decoded.

Figure 1:
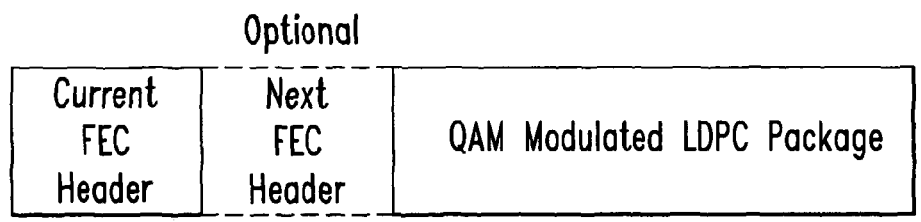
FIG. 1 shows the structure of the LDPC signaling part of the Data Slice Packet along with the position of the FEC Header and optional Next FEC Header.
Figure 2:
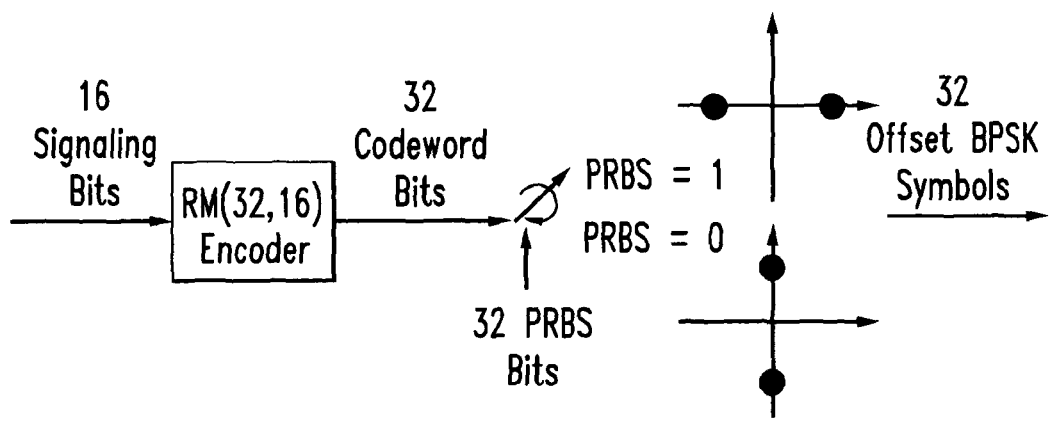
FIG. 2 shows one embodiment of some of the principles of the present invention.

The placement of the FEC Header is shown in FIG. 1 and the present principles of encoding the header information are accomplished, in part, according to FIG. 2. FIG. 1 shows the FEC Header placement of the current FECFrame, labeled as QAM Modulated LDPC Packet in FIG. 1, along with an optional Next FEC Header, which is the header that is used for the next FECFrame. The modulation order of the FEC Header can also be adapted so that it is based on the modulation order of the FEC Frame data portion. As an example, if the FEC Frame is modulated with either 16-QAM or 64-QAM, then BPSK can be used for the modulation of the FEC Header. If the FEC Frame is modulated with either 256-QAM, 1K-QAM, or 4K-QAM, then QPSK can be used as the modulation for the FEC Header.

FIG. 2 shows how the 16 signaling bits of the FEC Header can be further encoded using the present principles for either a 16-QAM or 64-QAM modulated FEC Frame. The sixteen signaling bits of the FEC Header are first FEC encoded, for example, by Reed-Muller(32,16) coding. The 32 codeword bits that are an output of the Reed-Muller (32,16) coding are then modulated by offset BPSK according to 32 bits of a pseudo-random binary sequence. This process results in 32 offset BPSK symbols. In a higher signal-to-noise environment, offset QPSK modulation can be used for the FEC Header coding, resulting in only 16 symbols.

Figure 3:
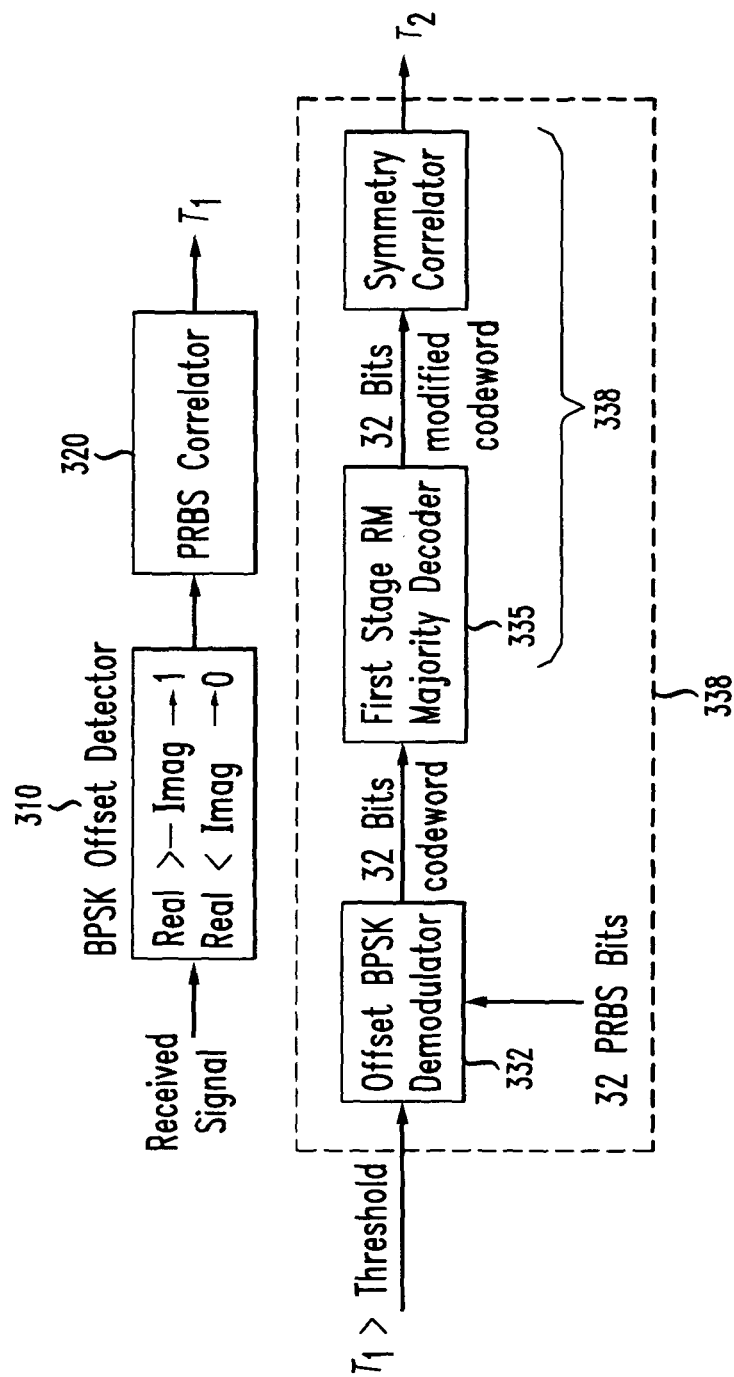
FIG. 3 shows one embodiment of a detector for the FEC Header under some of the principles of the present invention.

FIG. 3 illustrates detection of the FEC Header for the offset BPSK case. The received signal is demodulated with a BPSK offset detector 310 whose output is correlated with a pseudo-random binary sequence by means of the PRBS correlator 320. If the correlation is greater than a threshold value, the Reed-Muller symmetry detection 330 is performed. Threshold values can be chosen based on empirical evidence of values which show good correlation performance of the BPSK demodulated signal. The Reed-Muller(32,16) code is a second order Reed-Muller code and its codewords do not have a symmetrical structure, unlike a first order Reed-Muller code. Decoding of the Reed-Muller(32,16) code consists of three stages of majority decoding and after the first stage 335, the modified codeword has a symmetrical structure like a first order Reed-Muller code. This symmetry structure can be used to assist in the detection of the FEC Header. The results of the pseudo-random binary sequence correlation 332 and Reed-Muller symmetry correlation 338 are combined to make the decoding decision.

Simulation results have shown that use of Reed-Muller(32, 16) code with BPSK modulation can achieve error free results for FEC Header signaling at 10 dB SNR in additive white Gaussian noise (AWGN) channels. Majority decoding has very low complexity leading to simple decoders as well.

The present description illustrates the present principles as applied to the 16-bit header of DVB-C2 as an example. It will thus be appreciated that those skilled in the art will be able to devise various arrangements that, although not explicitly described or shown herein, embody the present principles and are included within its spirit and scope. The present principles are equally applicable to header information of different lengths with appropriate modification of the methods and apparatus of the present invention.

Figure 4:
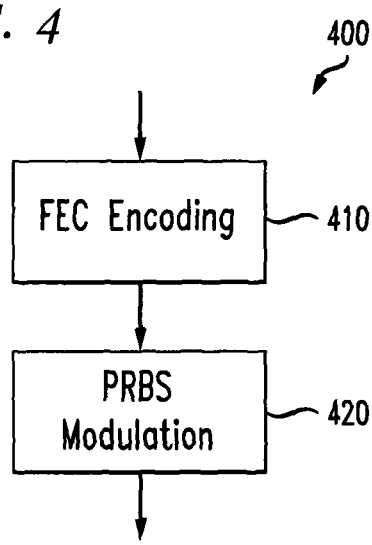
FIG. 4 shows a flowchart depicting the method of encoding under the principles of the present invention.

FIG. 4 illustrates the method of encoding the FEC frame header. Encoding is performed by FEC encoding step 410. This encoding can be, for example, Reed-Muller(32,16) encoding. Following this step, modulation step 420 performs a modulation of the encoded header output, using a pseudo-random binary sequence. The modulation performed by step 420 can be, for example, BPSK or QPSK.

Figure 5:
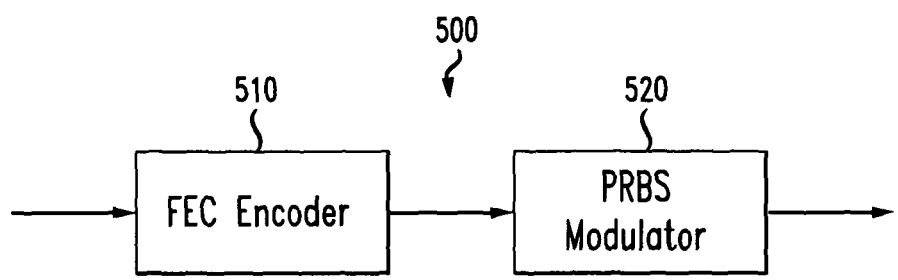
FIG. 5 shows an apparatus according to the principles of the present invention.

FIG. 5 illustrates the apparatus for encoding the FEC Frame header. FEC Encoder 510 is used to perform encoding of the input FEC Frame header, such as Reed-Muller(32,16) encoding. The output of encoding block 510 is fed to a modulator block 520. Modulator block 520 is used to perform a modulation of the FEC encoded frame header value using a pseudo-random binary sequence. The modulation can be, for example, BPSK or QPSK.

Figure 6:
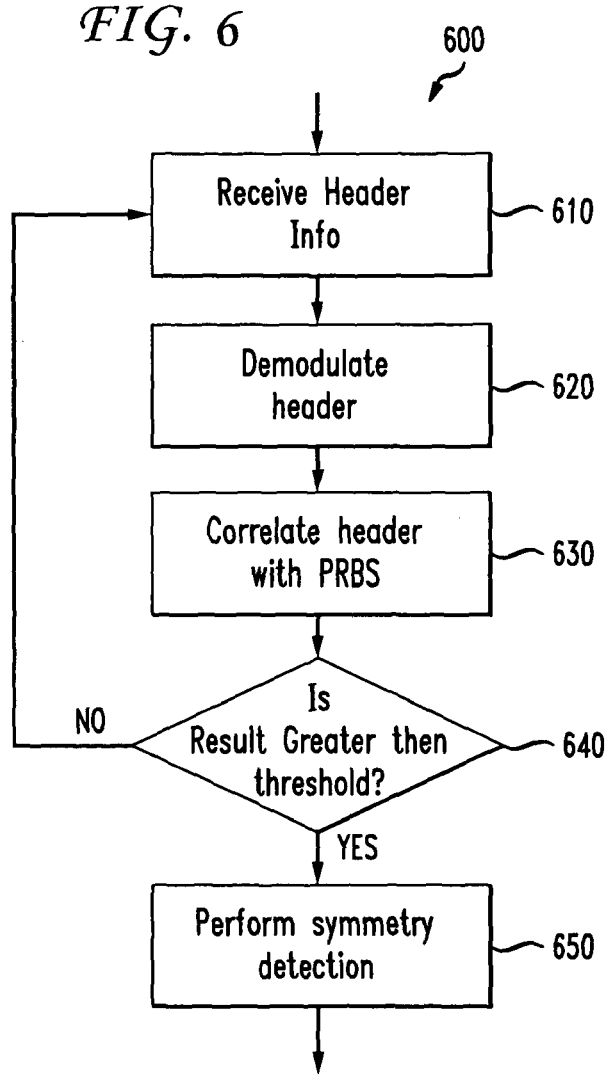
FIG. 6 shows a flowchart depicting the method of decoding under the principles of the present invention.

FIG. 6 illustrates the method of detecting the FEC frame header. Step 610 receives the header information. The header is then demodulated in step 620 by, for example, a BPSK offset detector. In step 630, the demodulated header output is correlated with a pseudo-random binary sequence. The result of this correlation is then compared with a threshold in step 640. If the correlation result is greater than a threshold, symmetry detection is performed in step 650. If the result of the correlation is not greater than the threshold, the process is reinitialized by receiving header information.

Figure 7:
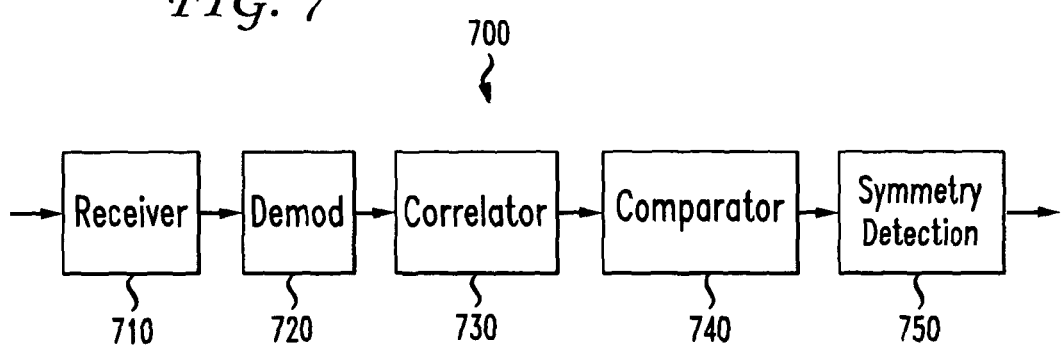
FIG. 7 shows an apparatus for decoding under the present principles.

FIG. 7 illustrates the apparatus for decoding header information using the present principles. Receiver block 710 receives header information. The received headers are input to demodulator block 720 which demodulates the received header information. Correlator block 730 is used to correlate the demodulated received header information with a pseudo-random binary sequence to produce a correlation result. Comparator block 740 compares the correlation output with a chosen threshold. Symmetry detector block 750 performs a detection on the demodulated received header information if the correlation result is greater than a threshold.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The invention claimed is:

1. A method of encoding header information, the method comprising:
    encoding the header bits for data packets in a digital cable television environment using Reed-Muller coding;
    modulating the output of the Reed-Muller coding with a pseudo-random binary sequence in a modulator, wherein the pseudo-random binary sequence is used to select one of the two offset constellations of an offset modulation method and the output of the Reed-Muller coding is used to select modulator symbols within one of the two offset constellations.

2. The method of claim 1, wherein the Reed-Muller encoding step uses a second order Reed-Muller code.

3. The method of claim 1, wherein the modulating step uses offset binary phase shift keying.

4. The method of claim 1, wherein the modulating step uses offset quadrature phase shift keying.

5. The method of claim 1, wherein the modulating step uses a modulation method that is different from but dependent upon which modulation method is used for a data portion of said data packets, wherein said data portion excludes said header information.

6. The method of claim 5, wherein offset binary phase shift keying is used to modulate said header information when 16-QAM or 64-QAM is used for said data portion of said data packets, and wherein offset quadrature phase shift keying is used to modulate said header information when 256-QAM, 1K-QAM, or 4K-QAM is used for said data portion of said data packets, wherein QAM means Quadrature Amplitude Modulation.

7. An apparatus for encoding header information, comprising:
   a Reed-Muller encoder for encoding data packets in a digital cable television environment; and
   a modulator for processing the output of the Reed-Muller encoder with a pseudo-random binary sequence, wherein the pseudo-random binary sequence is used to select one of the two offset constellations of an offset modulation method and the output of the Reed-Muller encoder is used to select modulator symbols within one of the offset constellations.

8. The apparatus of claim 7, wherein the Reed-Muller encoder uses a second order Reed-Muller code.

9. The apparatus of claim 7, wherein the modulator uses offset binary phase shift keying.

10. The apparatus of claim 7, wherein the modulator uses offset quadrature phase shift keying.

11. The apparatus of claim 7, wherein the modulator uses a modulation method that is different from but dependent upon which modulation method is used for a data portion of said data packets, wherein said data portion excludes said header information.

12. The apparatus of claim 11, wherein offset binary phase shift keying is used to modulate said header information when 16-QAM or 64-QAM is used for said data portion of said data packets, and wherein offset quadrature phase shift keying is used to modulate said header information when 256-QAM, 1K-QAM, or 4K-QAM is used for said data portion of said data packets, wherein QAM means Quadrature Amplitude Modulation.

13. A method of decoding header information, the method comprising:
   receiving header information for data packets in a digital cable television environment;
   demodulating said received header information in a demodulator;
   correlating said demodulated received header information with a pseudo-random binary sequence to produce a correlation result, wherein the pseudo-random binary sequence is used to select one of the two offset constellations of an offset modulation method and obtaining demodulator symbols within one of the offset constellations; and
   conditionally performing a Reed-Muller symmetry detection on said demodulator symbols of said demodulated received header information.

14. The method of claim 13, wherein said condition for performing symmetry detection is when said correlation result is greater than a threshold.

15. The method of claim 13, wherein the Reed-Muller detection step uses a second order Reed-Muller code.

16. The method of claim 13, wherein the demodulating step uses offset binary phase shift keying.

17. The method of claim 13, wherein the demodulating step uses offset quadrature phase shift keying.

18. The method of claim 13, wherein the demodulating step uses a demodulation method that is different from but dependent upon which modulation method is used for a data portion of said data packets, wherein said data portion excludes said header information.

19. The method of claim 18, wherein offset binary phase shift keying is used to demodulate said header information when 16-QAM or 64-QAM is used for said data portion of said data packets, and wherein offset quadrature phase shift keying is used to demodulate said header information when 256-QAM, 1K-QAM, or 4K-QAM is used for said data portion of said data packets, wherein QAM means Quadrature Amplitude Modulation.

20. An apparatus for decoding header information, comprising:
   a receiver for receiving header information for data packets in a digital cable television environment;
   a demodulator for demodulating said received header information;
   a correlator for correlating said demodulated received header information with a pseudo-random binary sequence to produce a correlation result, wherein the pseudo-random binary sequence is used to select one of the two offset constellations of an offset modulation method and for obtaining demodulator symbols within one of the two offset constellations; and
   a Reed-Muller symmetry detector for conditionally processing said demodulator symbols of the demodulated received header information.

21. The apparatus of claim 20, wherein said condition causing said symmetry detector to process said demodulated received header information is that said correlation result is greater than a threshold.

22. The apparatus of claim 20, wherein the Reed-Muller detector uses a second order Reed-Muller code.

23. The apparatus of claim 20, wherein said demodulator uses offset binary phase shift keying.

24. The apparatus of claim 20, wherein said demodulator uses offset quadrature phase shift keying.

25. The apparatus of claim 20, wherein said demodulator uses a demodulation method that is different from but dependent upon which modulation method is used for a data portion of said data packets, wherein said data portion excludes said header information.

26. The apparatus of claim 25, wherein said demodulator uses offset binary phase shift keying to demodulate said header information when 16-QAM or 64-QAM is used for said data portion of said data packets, and wherein said demodulator uses offset quadrature phase shift keying to demodulate said header information when 256-QAM, 1K-QAM, or 4K-QAM is used for said data portion of said data packets, wherein QAM means Quadrature Amplitude Modulation.

* * * * *